(12) United States Patent
Tsuda et al.

(10) Patent No.: US 7,709,858 B2
(45) Date of Patent: May 4, 2010

(54) NITRIDE SEMICONDUCTOR LIGHT EMITTING DEVICE

(75) Inventors: Yuhzoh Tsuda, Sakurai (JP); Takeshi Kamikawa, Mihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 387 days.

(21) Appl. No.: 11/206,222

(22) Filed: Aug. 18, 2005

(65) Prior Publication Data

US 2006/0038166 A1    Feb. 23, 2006

(30) Foreign Application Priority Data

Aug. 19, 2004    (JP)    ............... 2004-239467

(51) Int. Cl.
*H01L 27/15* (2006.01)
*H01L 29/26* (2006.01)
*H01L 31/12* (2006.01)
*H01L 33/00* (2006.01)

(52) U.S. Cl. .................. 257/103; 257/79; 257/E33.025; 257/E33.03

(58) Field of Classification Search .................. 257/103, 257/622, E21.097, E21.125
See application file for complete search history.

(56) References Cited

U.S. PATENT DOCUMENTS

| 6,784,074 | B2 * | 8/2004 | Shchukin et al. ............ 438/412 |
| 2003/0145783 | A1 | 8/2003 | Motoki et al. |
| 2004/0089919 | A1 * | 5/2004 | Motoki et al. ............... 257/613 |
| 2005/0048682 | A1 | 3/2005 | Takatani et al. |
| 2005/0141577 | A1 * | 6/2005 | Ueta et al. .................... 372/43 |
| 2005/0221590 | A1 | 10/2005 | Kano et al. |
| 2006/0172513 | A1 * | 8/2006 | Yanashima et al. .......... 438/483 |

FOREIGN PATENT DOCUMENTS

| JP | 2003-124573 | 4/2003 |
| JP | 2004-146420 | 5/2004 |
| JP | 2004-221480 | 8/2004 |
| JP | 2004-356454 | 12/2004 |

* cited by examiner

*Primary Examiner*—Kenneth A Parker
*Assistant Examiner*—Anthony Ho
(74) *Attorney, Agent, or Firm*—Harness, Dickey & Pierce, P.L.C.

(57) ABSTRACT

A first region and a second region that has a defect density of which the value is higher than that of the first region are respectively formed so as to be aligned in stripe form in the direction parallel to the direction in which a dug out region extends, where atoms that terminate the surface of the first region are different from atoms that terminate the surface of the aforementioned second region, and the dug out region includes the first region and the second region.

19 Claims, 11 Drawing Sheets

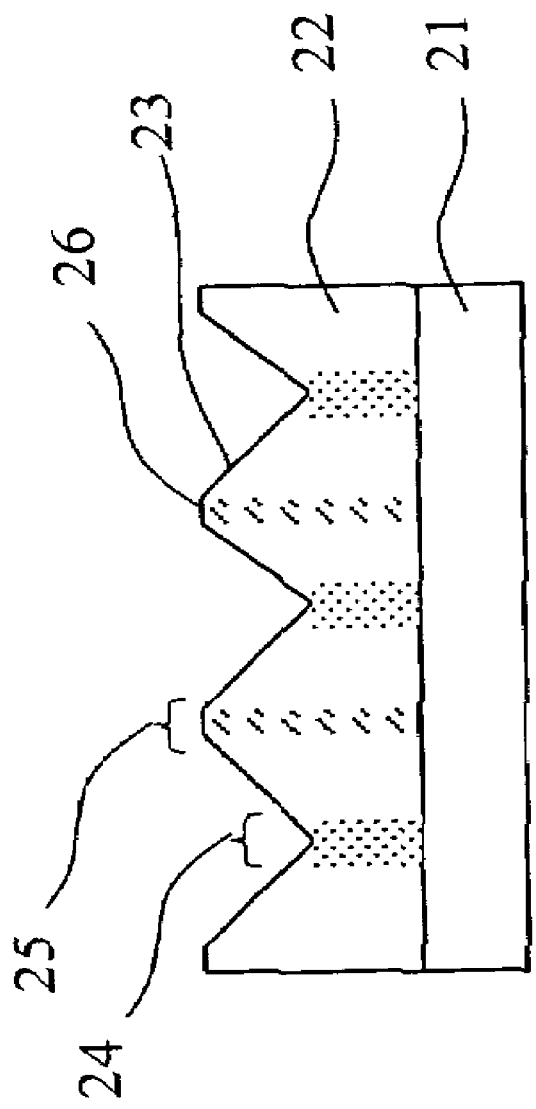
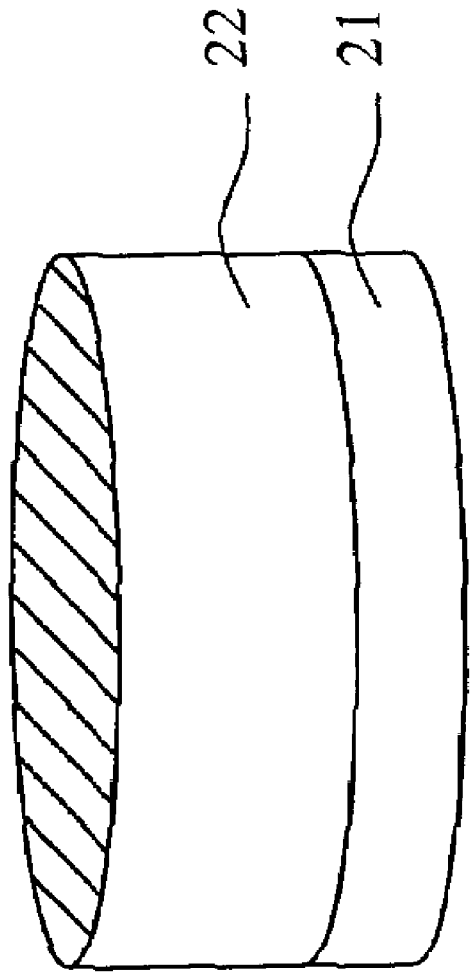
Fig.2a
Fig.2b

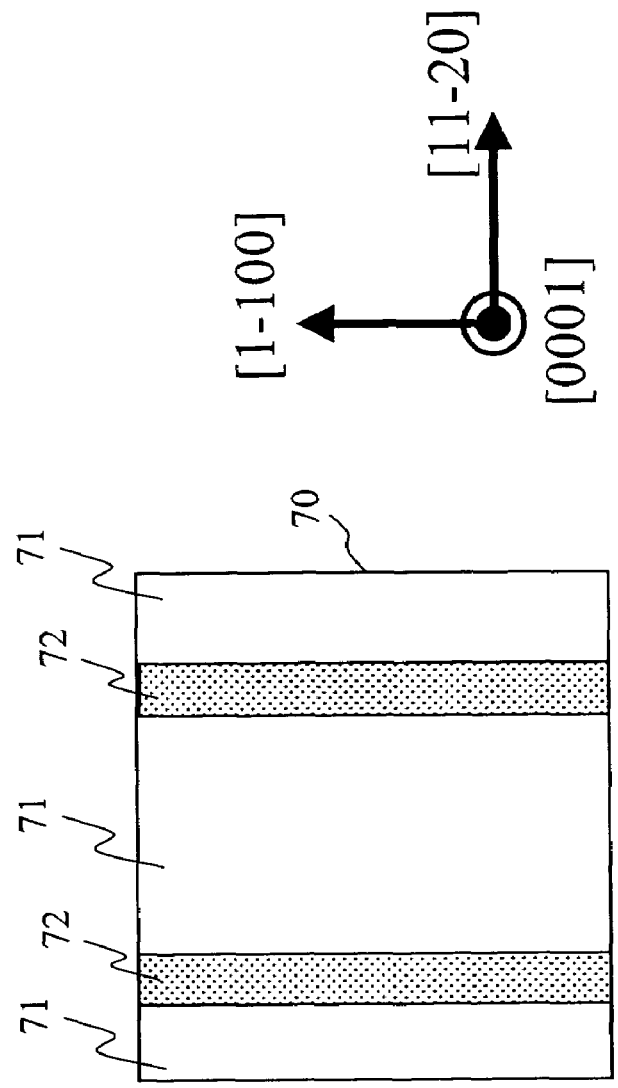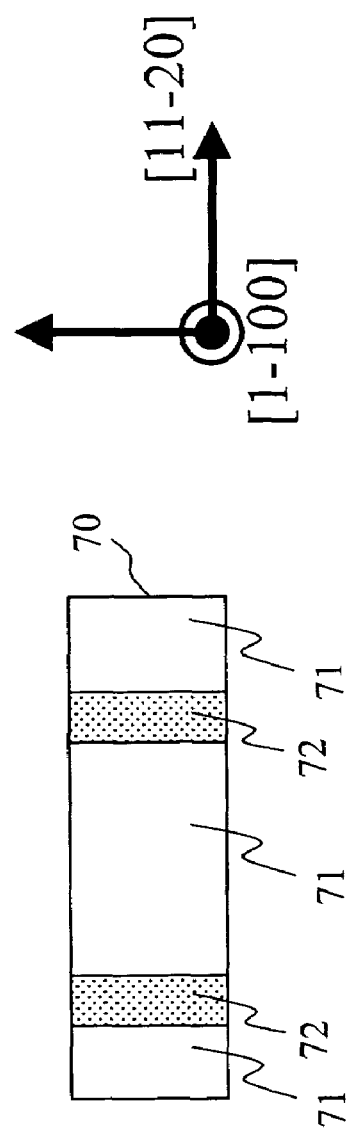
Fig.7a
Fig.7b

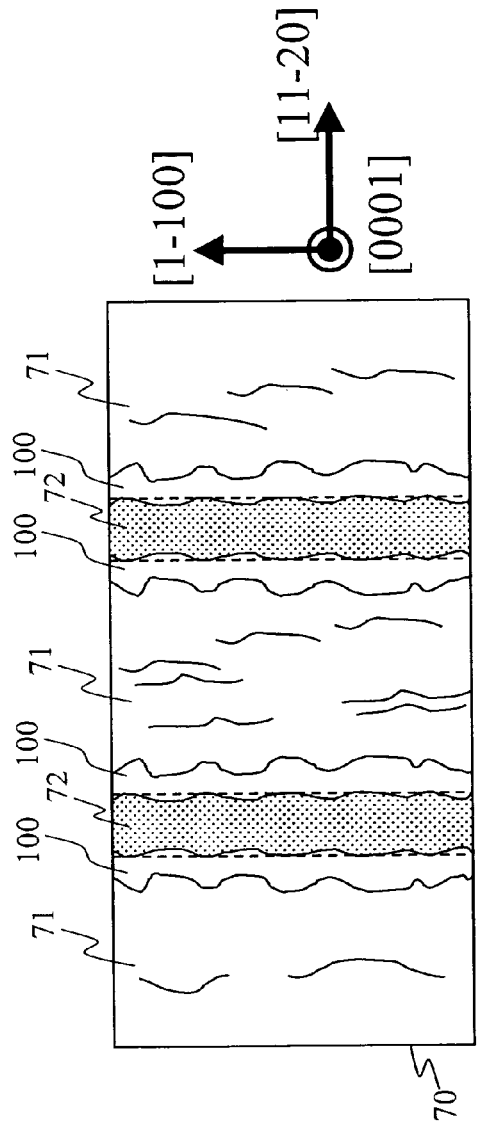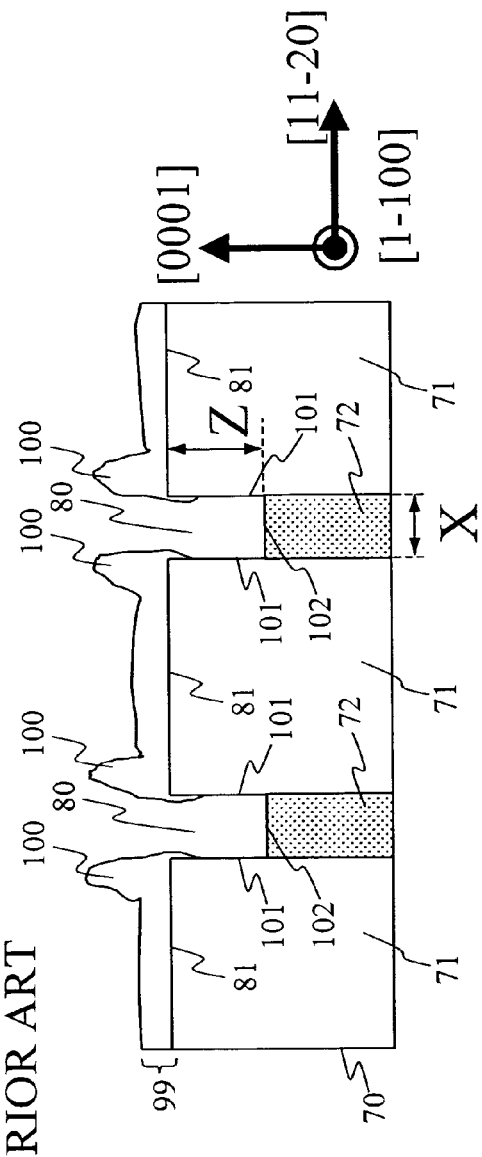

NITRIDE SEMICONDUCTOR LIGHT EMITTING DEVICE

BACKGROUND OF THE INVENTION

This application is based on Japanese Patent Application No. 2004-239467, filed on Aug. 19, 2004.

FIELD OF THE INVENTION

The present invention relates to a nitride semiconductor light emitting device such as a nitride semiconductor laser device.

DESCRIPTION OF THE PRIOR ART

Nitride semiconductors such as GaN, AlGaN, GaInN and AlGaInN have band gaps Eg which are greater than those of AlGaInAs-based semiconductors and AlGaInP-based semiconductors, and have features such that they are direct transition semiconductor materials. For this reason, these nitride semiconductors have attracted attention as materials for forming semiconductor light emitting devices, such as semiconductor lasers which can emit light having a short wavelength ranging from ultraviolet rays to green light, and light emitting diodes which cover a broad range of emitted light waves ranging from ultraviolet rays to red light, and are widely applicable to high density optical disks, full color displays and in the field of environment and medicine.

In addition, the aforementioned nitride semiconductors have heat conductivity that is higher than that of GaAs-based semiconductors, and can be expected to be applied to devices which operate at high temperatures and have high output. Furthermore, no material which corresponds to arsenic (As) in AlGaAs-based semiconductors or cadmium (Cd) in ZnCdSSe-based semiconductors, nor any source material thereof (such as arsine ($AsH_3$)) is utilized, and therefore, these nitride semiconductors can be expected to be environmentally friendly compound semiconductor materials.

In the conventional manufacture of a nitride semiconductor laser device which is a type of nitride semiconductor light emitting device, however, a problem arises where the yield, that is, the ratio of the number of devices obtained as good products to the total number of nitride semiconductor laser devices fabricated on one wafer is very low. The occurrence of cracking can be cited as one factor in the drop of the yield. Such occurrence of cracking, in some cases, is caused by defects in the substrate.

It is originally desirable to form and grow a nitride semiconductor growth layer, such as GaN, on a GaN substrate. So far, however, high quality GaN single crystal substrates that match the lattice of GaN have not yet been developed. Therefore, in some cases, an SiC substrate having a relatively small difference in the lattice constant is utilized. However, such SiC substrates are expensive, and it is difficult to increase the diameter thereof, and in addition, tensile strain may occur, and as a result, cracking easily occurs. Furthermore, the material of the substrate of nitride semiconductors is required to be resistant to growth temperatures as high as approximately 1000° C., and not to change in color or corrode in a material ammonium gas atmosphere.

For the aforementioned reasons, a sapphire substrate is conventionally used as the substrate on which a nitride semiconductor growth layer is layered. However, sapphire substrates do not match the lattice of GaN (by approximately 13%). Therefore, a buffer layer made of GaN or AlN is formed on a sapphire substrate by means of low temperature growth, and then, a nitride semiconductor growth film is grown on this buffer layer. However, it is still difficult to completely remove strain, and cracking may occur, depending on the composition or the condition of the film.

Therefore, a method for forming a nitride semiconductor laser device by using a GaN substrate that has been processed so as not to be affected by a region having a poor crystallinity on the GaN substrate has been proposed as a manufacturing method of a nitride semiconductor device using a GaN substrate (see JP-A 2003-124573).

According to JP-A 2003-124573, a plurality of regions (hereinafter referred to as high defect density regions) of which the density of defects is higher than a certain average density of dislocations, are regularly formed in a region having the average density of dislocations (hereinafter referred to as low defect density region) in a nitride semiconductor substrate such as a GaN substrate, and in addition, recesses and protrusions are formed on the surface of the nitride semiconductor substrate where the recesses are dug out by removing high defect density regions preventing the low defect density region from being affected by a high defect density region having a poor crystallinity. Furthermore, a nitride semiconductor growth layer formed of a plurality of nitride semiconductor thin films is layered on this nitride semiconductor substrate where the recesses and protrusions have been formed, and thereby, a nitride semiconductor laser device is fabricated.

Namely, in the aforementioned nitride semiconductor substrate, for example, a high defect density region 72 in stripe form is formed in the direction of [1-100] on an n-type GaN substrate 70 made of a low defect density region 71 as shown in FIGS. 7a and 7b. An $SiO_2$ film, or the like, is vapor-deposited in accordance with a sputter vapor deposition method, or the like, on the surface of the n-type GaN substrate 70. Next, a resist material is applied to the top of the $SiO_2$ film and a photoresist pattern in stripe form having an opening for the high defect density region 72 is formed in accordance with a conventional photolithographic technology. Subsequently, etching is carried out as deep as the middle of the substrate through the $SiO_2$ film and the surface having the high defect density region 72 of the n-type GaN substrate 70 in accordance with an etching technology such as RIE (Reactive Ion Etching), and thus the high defect density region 72 is partially removed. After that, the remained photoresist and the $SiO_2$ film are removed and then, as shown in FIGS. 8a and 8b, the n-type GaN substrate 70 is obtained, where a dug out region 80 which becomes a recess is formed in the portion of the high defect density region 72 and, in addition, a hill 81 which becomes a protrusion, is formed in low defect density portion 71. The width X of this dug out region 80 is set at 10 µm and the depth Z is set at 20 µm. In addition, the width Y of a hill 81 in the direction parallel to the direction of [11-20] is set at 400 µm. That is, the period of dug out regions 80, which is a distance between adjacent dug out regions 80, is set at 410 µm. Here, FIGS. 7a, 7b, 8a and 8b also show the plane directions. Though, in the case where an index which indicates the plane and direction of a crystal has a negative value, it is a rule to denote the index with a lateral line attached above its absolute value in crystallography, such a denotation is impossible in the present specification, and therefore, a negative index is denoted by attaching a minus symbol "−" in front of an absolute value.

When a nitride semiconductor laser device is fabricated using the n-type GaN substrate 70 that has been processed as described above, the nitride semiconductor growth layer thereof is formed, for example, as shown in FIG. 9.

Namely, a nitride semiconductor growth layer 99 that has been formed on the surface of the n-type GaN substrate 70, which has been etched, is formed in such a manner that an n-type GaN layer 91 having a thickness of 3 µm, an n-type $Al_{0.06}Ga_{0.94}N$ clad layer 92 having a thickness of 1.8 µm, an n-type GaN guide layer 93 having a thickness of 0.1 µm, a multiple quantum well active layer 94 formed of three InGaN well layers each having a thickness of 4 nm and four GaN barrier layers each having a thickness of 8 nm, a p-type $Al_{0.3}Ga_{0.7}N$ carrier block layer 95 having a thickness of 20 nm, a p-type GaN guide layer 96 having a thickness of 0.08 µm, a p-type $Al_{0.06}Ga_{0.94}N$ clad layer 97 having a thickness of 0.5 µm and a p-type GaN contact layer 98 having a thickness of 0.1 µm are sequentially layered on the surface of the n-type GaN substrate 70.

As described above, the nitride semiconductor growth layer 99 is layered on the surface of the n-type GaN substrate 70 where dug out regions 80 and hills 81 have been formed in accordance with an MOCVD (Metal Organic Chemical Vapor Deposition) method, or the like, and thereby, a nitride semiconductor laser device is fabricated.

When a nitride semiconductor laser device is fabricated in accordance with the aforementioned technology of JP-A 2003-124573, however, the nitride semiconductor growth layer 99 is layered on the n-type GaN substrate 70 after the dug out regions 80 that become recesses and the hills 81 that become protrusions have been formed, and then, a crystal growth occurs so as to make the layered nitride semiconductor growth layer 99 thicker or so as to form a lump shape in regions adjacent to the dug out regions 80 on both sides of the hills 81.

Namely, as shown in FIGS. 10a and 10b, the nitride semiconductor growth layer 99 is not formed at the bottom 102 of a dug out region 80, but rather formed on the surface of a hill 81 and on a portion of the surface of the sides 101 of a dug out region 80. In addition, an abnormal growth portion 100 where the thickness of the nitride semiconductor growth layer 99 is greater than the center portion of a hill 81 is formed in a region of the surface of a hill 81 adjacent to a dug out region 80. An abnormal growth portion 100 is formed in this manner because the rate of growth of a nitride semiconductor thin film that forms nitride semiconductor growth layer 99 is greater in portions of the two sides of a hill 81 which are adjacent to the dug out region 80 than in the center portion of the hill 81. As described above, the rate of growth of a nitride semiconductor thin film on a hill 81 greatly differs between the portion on an abnormal growth portion 100 and the portion in the center portion of a hill 81 because re-evaporation probability which indicates a probability where atoms or molecules which once adhere to the surface of growth of a nitride semiconductor thin film and become the material of the nitride semiconductor thin film re-evaporate from the surface of the growth without forming the nitride semiconductor thin film.

Atoms or molecules which become the material that adheres to the surface of a hill 81 between dug out regions 80 migrate on the surface of the growth to an energetically stable region, and after that, combine with atoms or molecules in the surface thereof and become a nitride semiconductor thin film. In the case where they fail to migrate to an energetically stable region within a constant period of time, however, they re-evaporate from the surface of the growth. In addition, it is known that in the case where a dug out region 80 is formed in the surface of a substrate such as the aforementioned n-type GaN substrate 70, energetically the most stable portion in a hill 81 between dug out regions 80 is an end which is in the vicinity of the dug out regions 80. Accordingly, the probability of re-evaporation in an end portion in the vicinity of such a dug out region 80 is low. In addition, in the case where the depth Z of a dug out region 80 (20 µm) is greater than the width X of the opening (10 µm), the probability of re-evaporation in an end portion of a hill 81 in the vicinity of a dug out region 80 is lowered. As a result, the rate of growth of a nitride semiconductor thin film in the end portions of a hill 81 in the vicinity of a dug out region 80 is greater than the other portions, including the center portion, of the hill 81, and thus, an abnormal growth portion 100 which is a protrusion having a great thickness is formed.

In addition, the nitride semiconductor growth layer 99 is not formed on the bottom 102, because the high defect density region 72 is exposed from the surface of the bottom 102. The surface of this high defect density region 72 is terminated with nitride atoms and therefore, it is difficult for atoms or molecules that become the material of a nitride semiconductor thin film to adhere to the surface when the nitride semiconductor growth layer 99 is layered on the surface. Therefore, no nitride semiconductor thin film is formed on the bottom 102 of a dug out region 80. Furthermore, atoms or molecules which become the material of a nitride semiconductor thin film and which once entered into a dug out region 80 from the atmosphere of a growth furnace that is used to layer a nitride semiconductor growth layer 99 on an n-type GaN substrate 70 and fail to adhere to the bottom 102 are again discharged into the atmosphere within the growth furnace or adhere to a hill 81. Then, such atoms or molecules which adhere to such a hill 81 migrate on the hill 81, and as a result, the rate of growth of the abnormal portion 100 is further increased as described above. Here, in the following a crystal growth that forms a lamp shape in such a specific region is referred to as "abnormal growth".

When such an abnormal growth occurs, no flat surface of the nitride semiconductor growth layer 99 is obtained at the time of layering of the nitride semiconductor growth layer 99 on a nitride semiconductor substrate such as the n-type GaN substrate 70. As a result, a problem arises in the following steps, in particular a photolithographic step. That is, in the case where there is a lump portion as a result of an abnormal growth on the surface of the nitride semiconductor growth layer 99 when a photoresist is applied to the top of the nitride semiconductor substrate on which the nitride semiconductor growth layer 99 has been layered, the photoresist is exposed to light while blocking specific portions using a reticle and the resist is dissolved during development, the thickness of the applied resist is derived from the set value resulting in the occurrence of a shift in the depth of focus when the resist is exposed to light and a desired resist form can not be obtained. Therefore, a desired form or precise dimensions can not be obtained when the nitride semiconductor growth layer 99 is subsequently processed in accordance with a dry etching technology, and thus, a nitride semiconductor laser device having a designed form can not be obtained. As a result, the yield is decreased.

SUMMARY OF THE INVENTION

In view of such problems, an object of the present invention is to provide a nitride semiconductor light emitting device where an abnormal growth of a nitride semiconductor growth layer can be suppressed when the nitride semiconductor growth layer is layered on a nitride semiconductor substrate where a low defect density region and a high defect density region have been provided within the substrate and a dug out region that becomes a recess and a hill that becomes a protrusion have been formed on the surface.

In order to achieve the aforementioned object, the present invention provides a nitride semiconductor light emitting device including: a processed substrate where a dug out region which is a recess in stripe form and a hill which is a protrusion are provided in a surface of a nitride semiconductor substrate where at least the surface is formed of a nitride semiconductor; and a nitride semiconductor growth layer which is formed of a plurality of nitride semiconductor thin films layered on the surface of the processed substrate, wherein a first region having a first average defect density and a second region having a defect density of which the value is higher than that of the first average defect density are respectively formed so as to be aligned in stripe form in the direction parallel to the direction in which the dug out region extends in the processed substrate, atoms that terminate the surface of the first region and atoms that terminate the surface of the second region are different from each other, and, in the processed substrate before the nitride semiconductor growth layer is layered, the dug out region includes the second region in a manner where the first region and the second region are both exposed from the bottom of the dug out region and the second region is not exposed from the portions other than the bottom in the dug out region.

In the nitride semiconductor light emitting device, the value of the width of the opening of the dug out region is greater than that of the depth of the dug out region.

In such a configuration, atomic or molecular gases that become the materials of the nitride semiconductor thin film directly enter into the dug out region so that the nitride semiconductor thin film is formed on the sides and the bottom within the dug out region. Therefore, the nitride semiconductor thin film that has grown on the hill is bonded to the nitride semiconductor thin film that has grown on the sides and the bottom within the dug out region. As a result, atoms and molecules that become the material of the nitride semiconductor thin film that adheres to the surface of the nitride semiconductor thin film that has grown on the hill easily migrate into the dug out region without staying on the hill. Consequently, an abnormal growth of the nitride semiconductor growth layer on both end portions of the hill can be suppressed.

In the nitride semiconductor light emitting device, the dug out region is not completely filled in with the nitride semiconductor growth layer. This is because the effects of suppressing the abnormal growth in both end portions of the hill disappear in the case where the dug out region is filled in with the nitride semiconductor growth layer.

In the nitride semiconductor light emitting device, preferably, atoms that terminate the surface of the second region are nitrogen. Preferably, atoms that terminate the surface of the first region are gallium.

As described above, in the case where atoms that terminate the respective surfaces are different from each other between the first region and the second region, the coefficients of adhesion of atoms or molecules that become the material of the nitride semiconductor thin film differ from each other and it becomes difficult for the nitride semiconductor thin film to be formed particularly on the surface of the second region which is terminated with nitrogen. Thus, a protrusion having a great thickness is formed in the first region which is located in the periphery of the second region at the bottom of dug out regions. As a result of this, the abnormal growth that has occurred in the end portions of the hill according to the prior art can be suppressed. In addition, the protrusion having a great thickness is formed in the dug out region, and therefore, no problem arises in the aforementioned photolithographic steps.

In the nitride semiconductor light emitting device, preferably, the off angle of the upper surface of the nitride semiconductor substrate is in a range between 0.15° and 0.5°, both ends inclusive.

In the nitride semiconductor light emitting device, preferably, the width of the opening of the dug out region is in a range between 20 μm and 100 μm, both ends inclusive.

In the nitride semiconductor light emitting device, preferably, the depth of the dug out region is in a range between 3 μm and 10 μm, both ends inclusive.

In the nitride semiconductor light emitting device, preferably, the width of the second region in the direction perpendicular to the direction in which the second region extends in stripe form is in a range between 15 μm and 50 μm, both ends inclusive.

In the nitride semiconductor light emitting device, preferably, the gap between the boundary between the first region and the second region on the surface of the bottom and the side of the dug out region that is adjacent to the boundary is 2 μm or more within the dug out region. As a result of this, the protrusion having a great thickness can be formed in the first region within the dug out region so as to have a sufficient thickness.

In the nitride semiconductor light emitting device, preferably, the width of the hill is 400 μm or more. As a result of this, the flatness on the surface of the nitride semiconductor growth layer that is layered on the hill can be made excellent.

In the nitride semiconductor light emitting device, preferably, the thickness of the nitride semiconductor growth layer is 5 μm, both ends inclusive. As a result of this, the dug out region can be prevented from being filled in with the nitride growth layer.

In the nitride semiconductor light emitting device, preferably, the layer of the nitride semiconductor growth layer layered on the processed substrate which makes contact with the processed substrate is a multilayered film formed of an $Al_xGa_{1-x}N$ layer and an $Al_yGa_{1-y}N$ layer of which the Al component ratios are different, and the relationship between the Al component ratio x of the $Al_xGa_{1-x}N$ layer and the Al component ratio y of the $Al_yGa_{1-y}N$ layer satisfies $0<x\leqq0.3$, $0<y\leqq0.1$ and $x<y$.

The multilayer film formed of films having different Al component ratios is layered in this manner, and thereby, the abnormal growth in the end portions of the hill can be suppressed, and the flatness of the surface of the layered multilayer film can be made excellent.

In the nitride semiconductor light emitting device, preferably, the thicknesses of the $Al_xGa_{1-x}N$ layer and the $Al_yGa_{1-y}N$ layer that form the multilayered film are both in a range between 80 nm and 3 μm, both ends inclusive.

In the nitride semiconductor light emitting device, preferably, the thickness of the $Al_yGa_{1-y}N$ layer of which the Al component ratio is large is thinner than the thickness of the $Al_xGa_{1-x}N$ layer of which the Al component ratio is small.

In the nitride semiconductor light emitting device, preferably, the nitride semiconductor thin film that forms the uppermost surface of the multilayered film is the $Al_xGa_{1-x}N$ layer of which the Al component ratio is small.

In the nitride semiconductor light emitting device, preferably, a ridge stripe for narrowing a current is formed in a portion of the first region other than the dug out region on the surface of the nitride semiconductor growth layer, and when the distance between the center portion of the ridge stripe and the center portion of the hill is denoted as d and the gap between the center portions of the two adjacent dug out regions in the direction perpendicular to the direction in which the dug out regions extends is denoted as A, 3 µm≦d≦0.25×A is achieved.

DESCRIPTION OF THE DRAWINGS

FIG. 2a is a cross sectional view showing a manufacturing process for an n-type GaN substrate;

FIG. 2b is a perspective view showing a manufacturing process for an n-type GaN substrate;

FIG. 7a is a schematic top view showing an n-type GaN substrate;

FIG. 7b is a schematic cross sectional view showing an n-type GaN substrate;

FIG. 10a is a schematic top view showing a portion of a wafer where a nitride semiconductor growth layer is layered on a processed substrate according to the prior art; and FIG. 10b is a schematic cross sectional view showing a portion of a wafer where a nitride semiconductor growth layer is layered on a processed substrate according to the prior art.

DESCRIPTION OF THE PREFERRED EMBODIMENTS

Figures 1A, 1B:
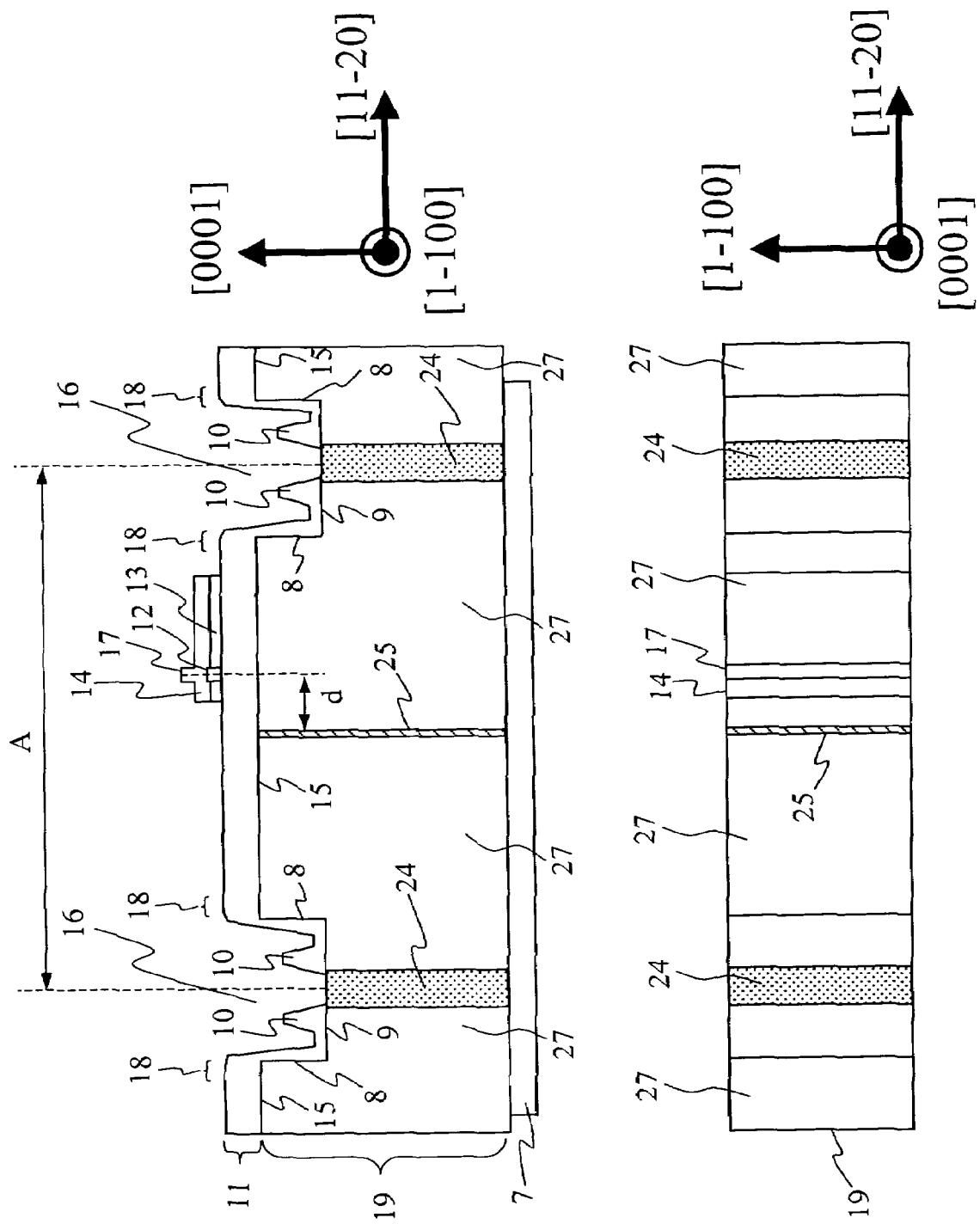
FIG. 1a is a schematic cross sectional view showing a portion of a wafer to which a nitride semiconductor laser device is provided according to an embodiment of the present invention.
FIG. 1b is a schematic top view showing a portion of a wafer to which a nitride semiconductor laser device is provided according to an embodiment of the present invention.

The definition of some terms is clarified in advance, in order to describe a variety of embodiments according to the present invention in the following. First, "dug out region" described in the present specification means a trench which is a recess that has been processed in stripe form in the surface of a processed substrate 19, for example, as shown in the below described FIG. 4b, and "hill" means a region that becomes a protrusion that has been processed in stripe form and a region excluding dug out regions.

"Nitride semiconductor substrate" described in the present specification means a substrate made of $Al_xGa_yIn_zN$ ($0 \leq x \leq 1$; $0 \leq y \leq 1$; $0 \leq z \leq 1$; $x+y+z=1$). Here, approximately 10% or less of the nitride elements within the nitride semiconductor substrate may be replaced other elements such as As, P or Sb (as long as the hexagonal system of the substrate is maintained). In addition, Si, O, Cl, S, C, Ge, Zn, Cd, Mg or Be may be doped into the nitride semiconductor substrate. Si, O and Cl are particularly preferable for an n-type nitride semiconductor from among these materials for doping.

"Substrate of a different type" described in the present specification means a substrate other than nitride semiconductors. Concretely speaking, a sapphire substrate, an SiC substrate, an Si substrate or a GaAs substrate is used as substrate of a different type.

"Processed substrate" described in the present specification means a substrate where a dug out region is formed in the surface of a nitride semiconductor substrate or in the surface of a nitride semiconductor thin film layer that has been layered on the surface of a substrate of a different type. Dug out regions may be formed so as to have a constant period, or may be formed so as to have various widths that are different from each other. In addition, as for the depth of the trench in dug out regions, all the trenches may have the same depth, or various depths that are different from each other.

The "polarity" of the surface of a nitride semiconductor substrate in a certain region as described in the present specification indicates with which atoms from among the types of atoms that form the nitride semiconductor substrate the surface of this region is terminated. In the case where, for example, the surface of a certain region in a GaN substrate is terminated with Ga atoms, the "polarity" of this region is Ga (gallium).

"Active layer" described in the present specification means the entirety of a layer formed of well layers and barrier layers. An "active layer" having a single quantum well structure is, for example, formed of only one well layer or a barrier layer/well layer/barrier layer. In addition, an "active layer" having a multiple quantum well structure is formed of a plurality of well layers and a plurality of barrier layers.

In addition, according to the embodiment described below, a GaN substrate is used as a nitride semiconductor substrate. GaN, which is the material of this GaN substrate, has a hexagonal system, and therefore, a method for denotation using four indices is adopted, in order to represent the direction of the axis or the plane direction. An axis a and an axis b form 120° and have the same length (a=b), and an axis c which crosses these axes at a right angle is a specific axis, and is not equal to the axis a (c≠a). Symmetry is lost when only the axes a and b represent the direction of the plane ab, and therefore, one more axis is assumed. This is axis d. Here, the axes a, b and d are provided by introducing one extra axis d to the axes a and b, so as not to lose symmetry, though the axes a and b are sufficient to designate the direction, and therefore, these are not independent from each other.

Provided that one parallel plane group is represented by four indices (klmn), this means that the distance of the points where the first surface counted from the origin crosses the axes a, b, d and c from the origin is a/k, b/l, d/m and c/n, respectively. This is the same definition as in the case of other crystal systems. Here, axes a, b and d are redundant coordinates which are included in a plane, and therefore, k, l and m are not independent from each other, but k+l+m=0 always holds. The axis c is the same as in the case of cubic crystal and the like. In the case where there are n equal parallel planes in the unit length of the axis c, the index in the direction of c becomes n. Therefore, the first three from among the four indices have rotational symmetry, while the index of the axis c is independent.

Individual plane directions are represented by ( . . . ). Collective plane directions are represented by { . . . }. Being collected means a set of all the plane directions which can be achieved by carrying out all the symmetry operations which are permitted in this crystal system on a certain plane direction. The direction of the crystal is represented by the same indices. The direction of the crystal is represented using the same indices as those used for the plane that is perpendicular thereto. Individual directions are represented by [ . . . ]. Collective directions are represented by < . . . >. Though this is common notation in crystallography, it is described in order to avoid confusion. It is a rule in crystallography that minus indices be indicated by drawing a lateral line above a numeral, which is intuitionally understandable. In the present specification, however, a lateral line cannot be drawn above a numeral, as described above, and therefore, minus indices are represented by attaching "−" in front of a numeral.

Fabrication of GaN Substrate

First, a method for fabricating a GaN substrate, which is one type nitride semiconductor substrate, where a nitride semiconductor growth layer is formed on the surface in order to fabricate a nitride semiconductor laser device, which is one type of nitride semiconductor light emitting device, is described with reference to FIGS. 2a, 2b, 2c and 2d. FIGS. 2a, 2b, 2c and 2d show a manufacturing process for an n-type GaN substrate.

A crystal grows so as to have a diagonal surface formed of a facet when this n-type GaN substrate is manufactured. Here, facet refers to a surface other than the surface that is perpendicular to the direction of growth (growth surface). This diagonal surface which becomes a facet is kept growing, and thereby, dislocations can be propagated in the direction of growth, so as to be collected at a predetermined point. The region where this facet has grown becomes a low defect density region, as a result of movement of crystal defects (=dislocation). In addition, a high defect density region having a clear boundary and defect regions of high density is grown in the lower portion of the diagonal surface that becomes the facet. Thus, dislocations are collected on the border or inside of this high defect density region, and therefore, they disappear or are stored within this high defect density region.

At this time, the form of the facet differs, depending on the form of this high defect density region. In the case where the high defect density region becomes of a dot form, the facet is formed so as to surround the high defect density region, and a pit made of the facet is formed. In addition, in the case where the high defect density becomes of a stripe form, the diagonal surfaces of the facets are formed on both sides of the high defect density region so as to become of a V shape, with the portion that becomes the stripe of this high defect density region as the bottom. Here, according to this embodiment, the high defect density region is in stripe form.

In order to form such a high defect density region, it is necessary to form a seed for the formation of dislocations, which is an amorphous or polycrystal layer, in advance in a place where a high defect density region is to be formed on a support substrate which is a base substrate. As described above, GaN is grown on a support substrate where a seed for the formation of dislocations has been formed on the surface, and thereby, a high defect density region is formed in a region immediately above this seed for the formation of dislocations. Thus, a GaN layer is grown so as to have such a high defect density region, and thereby, the growth can be made to progress without burying the facet, but rather, maintaining it.

Figure 2C:
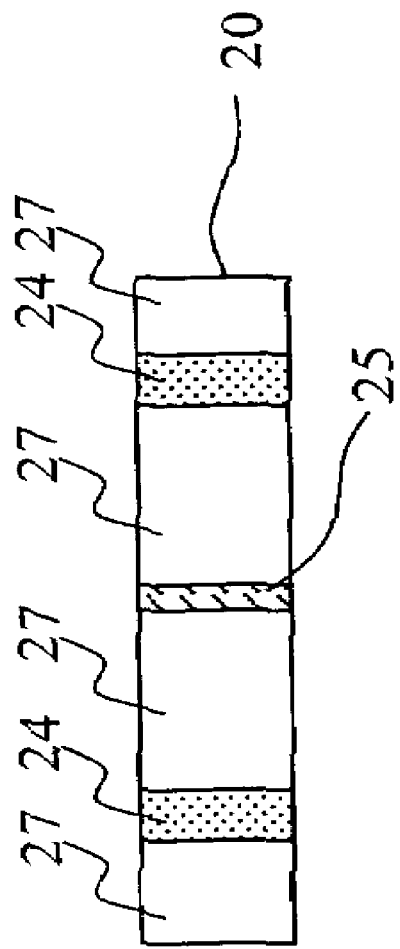
FIG. 2c is a cross sectional view showing a manufacturing process for an n-type GaN substrate.
Figure 2D:
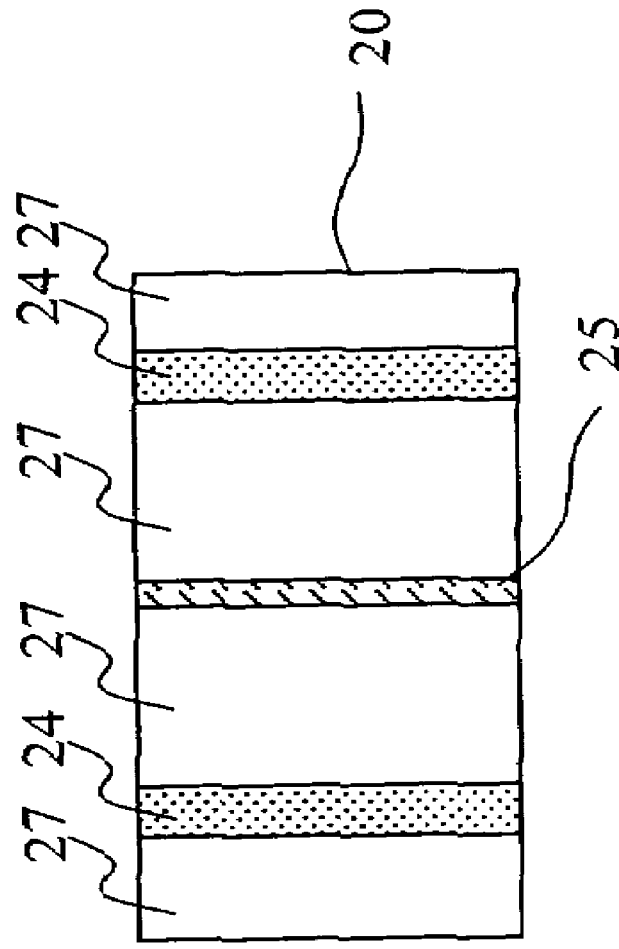
FIG. 2d is a top view showing a manufacturing process for an n-type GaN substrate.

Namely, as shown in FIGS. 2a, 2b, 2c and 2d, when an n-type GaN layer 22 is grown on a support substrate 21 in accordance with a hydride vapor phase epitaxial (HVPE) method, the facet 23 in the plane {11-22} is primarily exposed from the surface during the growth. As a result, as shown in FIG. 2a, the surface becomes uneven, in such a manner that the cross section thereof is in serrated form. Here, portions from which the surface 26 in the plane {0001} is slightly exposed are formed in stripe form, in the vicinity of the top of the protrusions.

At the time of formation in accordance with this HVPE method, a Ga boat is provided upstream from a hot wall-type reactive furnace, and an HCl gas is blown into a Ga melt that has been heated, while a support substrate 21 for growing an n-type GaN layer 22 is provided downstream from the reactive furnace, into which $NH_3$ is blown. Thus, HCl is blown into the Ga metal (melt) that has been heated, so that GaCl is synthesized, and then, this is sent below so as to be made to react with $NH_3$, and thus, GaN is synthesized and deposited on the substrate.

In addition, a two-inch GaAs wafer (111) is used as the support substrate 21. The unevenness shown in FIG. 2a has a periodical structure with a pitch (period) of 490 μm, and has a stripe form that extends in the direction downward from the paper. Such a GaAs wafer can be easily removed after an ingot of the below described n-type GaN layer 22 has been fabricated by growing GaN, and therefore, is appropriate as compared to a sapphire wafer or the like. In order to define the position of the aforementioned unevenness, a mask of $SiO_2$ having an opening that corresponds to the aforementioned recess (the opening corresponds to the aforementioned "seed for the formation of dislocations") is formed in advance on the support substrate 21, and a crystal may be grown in the state where a facet is exposed.

The opening of the mask is placed in stripe form with a period of 490 μm so as to become parallel in the direction of [1-100] of the GaN crystal, and the form of the mask may have a form of continuous stripes or be in an arrangement where dot forms are aligned along individual columns. In the following, according to this embodiment, though an example of a GaN substrate that has been fabricated by forming a mask of which the openings are in stripe form with gaps (period) of 490 μm between adjacent openings in the direction parallel to the direction of [11-20] is described, the period of the openings may not be 490 μm.

A technique (growth conditions) for continuing crystal growth in the state where a facet 23 in the plane {11-22} is exposed is disclosed in detail in JP-A 2001-102307 that has been previously filed by the present applicant. Here, a crystal that grows while oxygen is being doped at the time of growth is of the n-type.

As described above, crystal growth is continued in the state where the facet 23 in the plane {11-22} is exposed and the formation of a GaN crystal is further continued, and thereby, an ingot is fabricated from the n-type GaN layer 22 on the support substrate 21, as shown in FIG. 2b. At this time, a facet that corresponds to the form of the mask that becomes a seed is formed on the surface of the ingot. That is, in the case where the mask has a pattern in dot form, pits are regularly formed from the facets, while in the case where the mask has a pattern in stripe form, facets in V shape are formed.

Thin pieces (n-type GaN substrates) are obtained by slicing, and cutting and processing this ingot made of the n-type GaN layer 22 by means of a slicer. Furthermore, these thin pieces are polished and processed so that n-type GaN substrates 20 of which the surface is flat are obtained, as shown in the cross sectional view of FIG. 2c and the top view of FIG. 2d. After that, the surface of the n-type GaN substrates 20 is ground and polished so as to flatten the surface, thus achieving a usable state. That is, the surface of these n-type GaN substrates 20 is finished as a polished mirror surface for carrying out epitaxial growth.

Here, though this surface is approximately in the plane (0001), it is desirable, for the below described reasons, for this surface to have an off angle in a range between 0.15° and 0.5°, both ends inclusive, in the direction of [11-20] relative to the plane (0001).

An n-type GaN substrate 20 that has been formed as described above is submerged in a liquid of a mixed acid of sulfuric acid and phosphoric acid which has been heated to 250° C., so that wet etching is carried out, and etched pits where facets are collected are exposed from the surface. As a result, a number of etched pits appear in a region that correspond to the high defect density region 24, and thereby, it has been found that dislocations are extremely highly concentrated in this region. Dislocations are highly concentrated in this high defect density region 24, which corrodes more easily than other portions in a polishing process, and therefore, a recess is formed in this region.

The width of this high defect density region 24 where a recess has been formed is approximately from 15 μm to 50 μm. The region which is not this high defect density region 24 is a low defect density region 27 having an EPD (Etched Pit Density) of approximately $10^6$ cm$^{-2}$, while the EPD of the high defect density region 24 has a value as great as approximately $10^9$ cm$^{-2}$.

In addition, this high defect density region 24 is different from the other regions on the substrate, and the polarity is inverted. That is, the surface of the n-type GaN substrate 20, excluding the high defect region 24, is terminated with Ga (gallium), while the surface of the high defect density region 24 is terminated with N (nitrogen). When the polarity of the surface differs in this manner, adhesion coefficients which are indices for representing the ease with which atoms or molecules that become the material of the nitride semiconductor thin film adhere may also differ, as described below. Here, in the case where the adhesion coefficient is great, atoms or molecules that become the material of the nitride semiconductor thin film can easily be made to adhere to this region, and the rate of growth of the nitrogen semiconductor film also becomes great.

In addition, an n-type GaN substrate 20 was used as a sample and irradiated with ultraviolet rays (bright line of 365 nm from an Hg lamp), and luminescence on the surface, that is, fluorescent light, was observed with a microscope. As a result, a region in stripe form contrasting with the surroundings with a relatively clear border was observed at the center of a low defect density region 27 interposed between high defect density regions 24. This region had light emission (luminescence) that is more intense than the surroundings, so as to be observable with the naked eye, and is a region where bright, slightly yellowish emitted light was observable.

This region 25 where bright light emission was observed is a portion where the crystal grew while the surface 26 in the plane {0001} was being exposed during the growth. In the following, this region 25 is referred to as "high luminescence region". In addition, the portion that grew while the surface in the plane {0001} was being exposed during the crystal growth did not necessarily grow uniformly with the same width, and the width of the high luminescence region 25 has values in range from approximately 0 μm to 30 μm.

A method for growing a crystal in order to form such an n-type GaN substrate 20 may be a vapor phase epitaxy other than an HVPE method, and can be carried out in accordance with an MOCVD (Metal Organic Chemical Vapor Deposition) method, a sublimation method or the like.

In addition, single crystal substrates having rotational symmetry in six or three places around the axis, in addition to GaAs, can be used as the support substrate 21 that is used for the growth and the formation of an n-type GaN substrate 20. That is, single crystals having crystal systems of a hexagonal system or a cubic system can be used. In the case of a cubic system, symmetry is obtained in three places around the axis when a surface in the plane (111) is used. Single crystals having a hexagonal system such as sapphire, SiC, SiO$_2$, NdGaO$_3$, ZnO, GaN, AlN and ZrB$_2$ can be used. Substrates having the plane (111) of a cubic system, such as Si, spinet, MgO and GaP, can also be used. GaN is grown so as to show the plane (0001) at the growth surface.

Furthermore, there are two methods for providing a mask for the formation of an n-type GaN substrate 20. One is a technique for forming a mask directly on the support substrate 21. In this case, it is necessary to deposit a GaN buffer layer on the surface of the substrate that has been exposed from an opening in the mask prior to the formation of the epitaxial layer. The other method is a technique for forming a mask on a thin GaN layer that has been formed in advance on the support substrate 21. The latter method is more preferable, because the growth progresses smoothly.

Figure 3A:
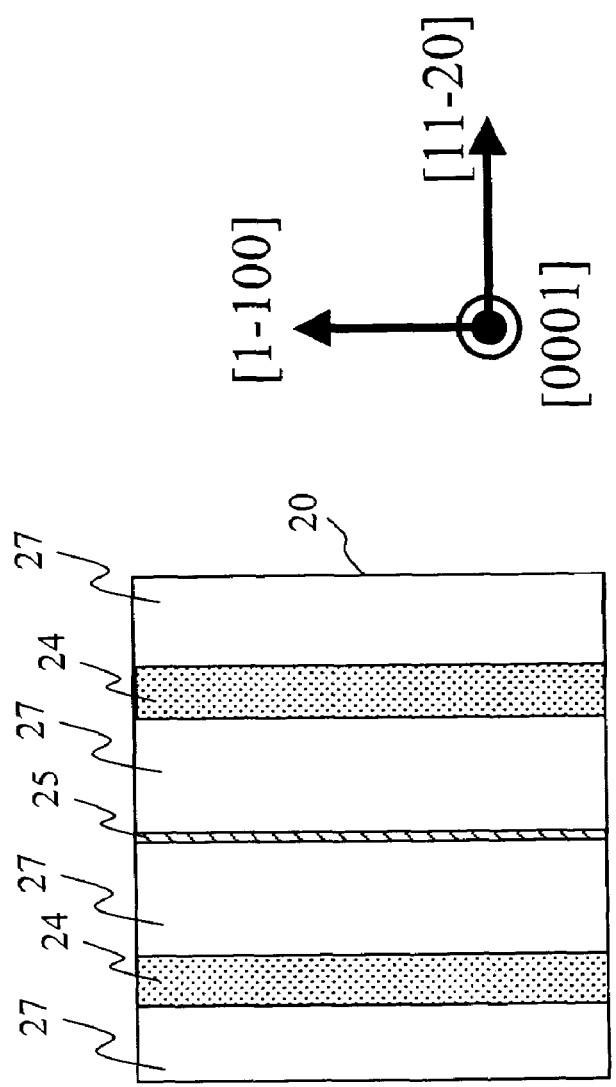
FIG. 3a is a schematic top view showing an n-type GaN substrate according to an embodiment of the present invention.
Figure 3B:
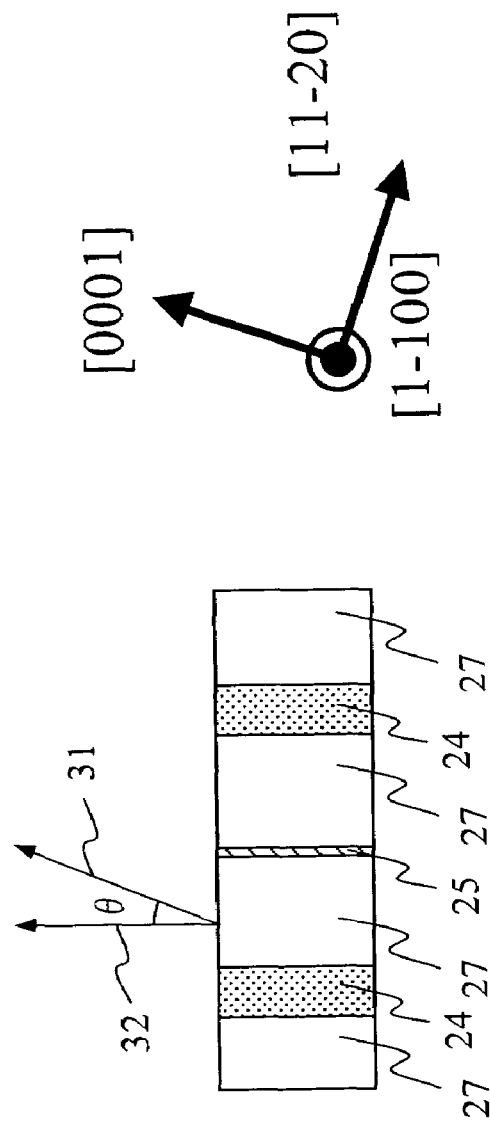
FIG. 3b is a schematic cross sectional view showing an n-type GaN substrate according to an embodiment of the present invention.

FIG. 3b shows a schematic cross sectional view of an n-type GaN substrate 20, which is one type of nitride semiconductor substrate, having a high defect density region 24, a low defect density region 27 of which the defect density is lower than the high defect density region 24, and a high luminescence region 25, which have been formed as described above. FIG. 3a is a top view of the n-type GaN substrate 20 of FIG. 3b. The direction of the axis c 31 has an off angle θ in the direction of [11-20] relative to the direction of the normal line 32 of the surface of the n-type GaN substrate 20. It is preferable for this off angle θ to be in a range between 0.15° and 0.5°, both ends inclusive, for the below described reasons. As described above, the high defect density region 24 and the high luminescence region 25 are formed on the n-type GaN substrate 20 so as to extend in stripe form in the direction of [1-100].

Fabrication of Nitride Semiconductor Laser Device

Figure 4A:
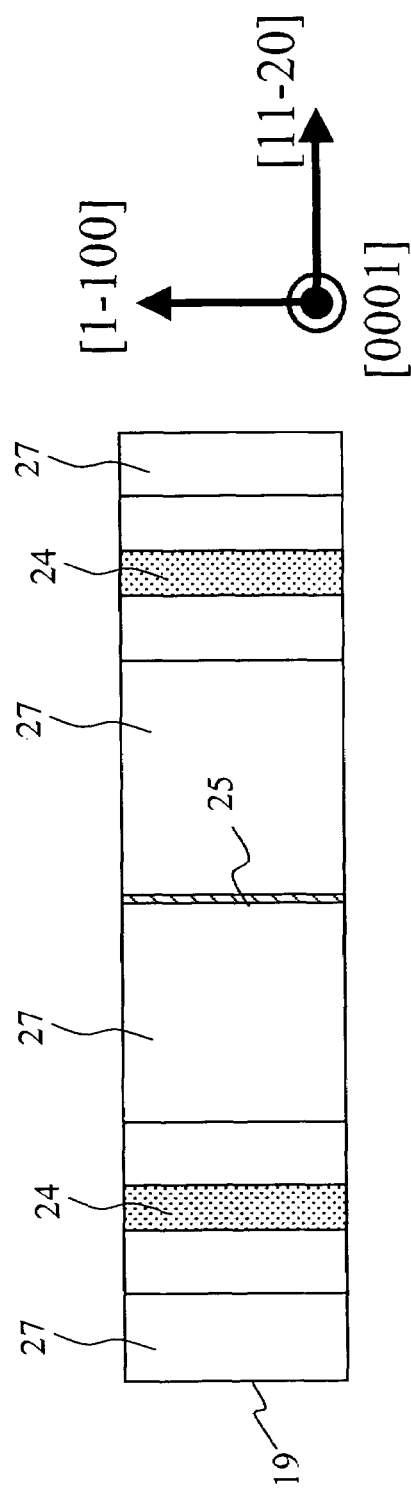
FIG. 4a is a schematic top view showing a processed substrate according to an embodiment of the present invention.
Figure 4B:
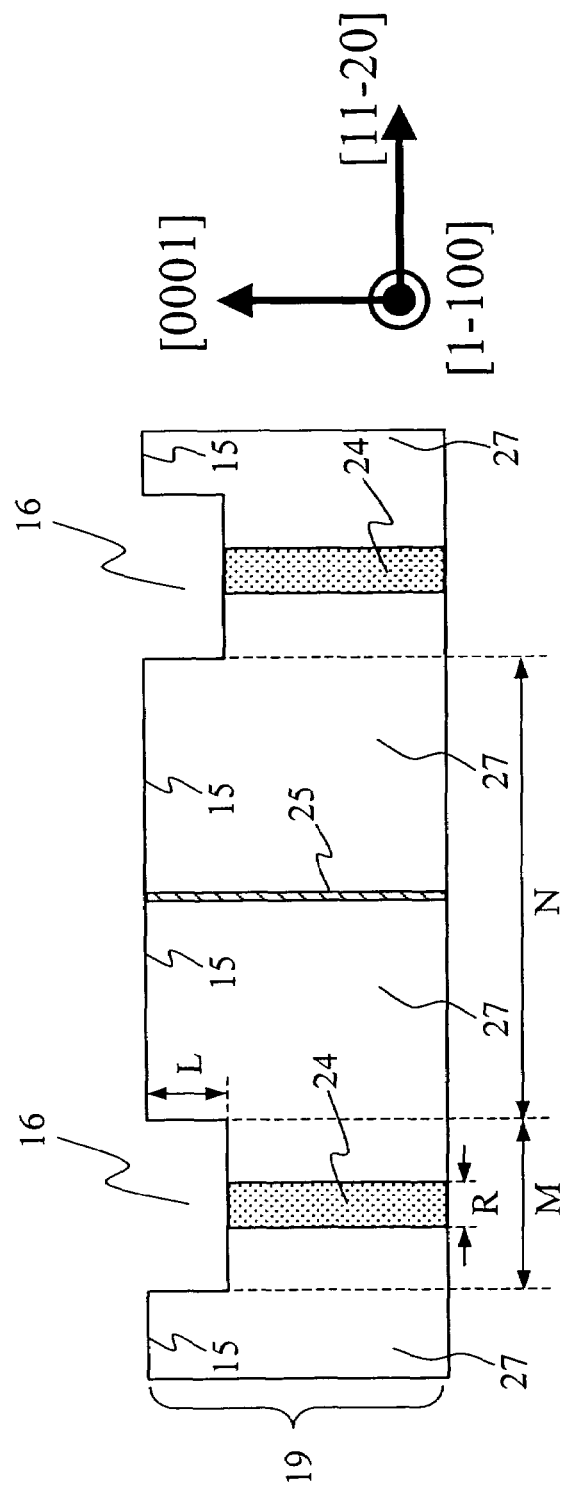
FIG. 4b is a schematic cross sectional view showing a processed substrate according to an embodiment of the present invention.

A nitride semiconductor light emitting device according to an embodiment of the present invention which is fabricated using an n-type GaN substrate 20 which is one type of nitride semiconductor substrates having a high defect density region 24 that has been formed as described above, a low defect density region 27 of which the defect density is lower than that of the high defect density region 24 and a high luminescence region 25 is described with reference to the drawings. Here, according to this embodiment, a nitride semiconductor laser device is described as an example of a nitride semiconductor light emitting device. FIG. 1a is a schematic cross sectional view showing a wafer on which a nitride semiconductor laser device is formed according to this embodiment. In addition, FIG. 1b is the top view of the wafer of FIG. 1a. In addition, FIG. 4b is a schematic cross sectional view showing a processed substrate 19 before a nitride semiconductor thin film is grown according to the embodiment of the present invention, and FIG. 4a is the top view of the processed substrate of FIG. 4b. FIGS. 1a, 1b, 4a, and 4b also show the plane directions. Here, the plane directions are shown assuming the off angles are zero. A nitride semiconductor growth layer 11

(see FIG. 1a) made of a plurality of nitride semiconductor thin films is layered on the processed substrate 19 shown in FIGS. 4a and 4b, and thereby, the nitride semiconductor laser device of FIG. 1a is obtained.

The nitride semiconductor laser device of this embodiment is fabricated by growing the nitride semiconductor growth layer 11 on the processed substrate 19 which has been formed of a nitride semiconductor substrate made of an n-type GaN with dug out regions 16 that become recesses. First, a method for fabricating the processed substrate 19 in this nitride semiconductor laser device is described with reference to the drawings. Here, the aforementioned n-type GaN substrate 20 is used as the processed substrate 19 according to this embodiment. In addition, the width R (see FIG. 4b) of the high defect density region 24 provided in the n-type GaN substrate 20 in the direction parallel to the direction of [11-20] is 20 μm and the off angle of the n-type GaN substrate 20 is 0.18°. An $SiO_2$ film or the like having a film thickness of 1 μm is deposited by means of sputtering vapor deposition on the entirety of the surface of this n-type GaN substrate 20, and subsequently, in the general photolithography step, a photoresist pattern in stripe form is formed in the direction of [1-100] so that the width of the openings in the resist becomes 40 μm and the gap (period) between the adjacent center portions of the stripes in the photoresist pattern becomes 490 μm in the direction parallel to the direction of [11-20]. At this time, the photoresist pattern is formed so that the center portions of the openings in the photoresist pattern and the center portions of the stripes of the high defect density regions 24 coincide with each other. Namely, the stripes of the high defect density regions 24 in the pattern are located at the centers of the openings of the photoresist pattern. In addition, many pits exist on the surface of the high defects density regions 24, and therefore, the high defect density regions 24 and other regions can be sufficiently differentiated through the observation with an optical microscope.

Subsequently, the $SiO_2$ film and the n-type GaN substrate 20 are etched using a dry etching technology such as an RIE technology, and thereby, dug out regions 16, where the dug out depth L is 3 μm and the width M of the opening is 40 μm, are formed. In addition, the width N of the hill 15 that becomes a protrusion formed between the adjacent dug out regions 16 is 450 μm. After that, the $SiO_2$ film is removed using HF (fluoric acid) as an etchant, and thereby, the processed substrate 19, before the nitride semiconductor growth layer 11 is layered on the surface thereof, is obtained as shown in FIGS. 4a and 4b. The high defect density regions 24 are exposed from the center portion of the bottom, and the low defect density regions 27 are exposed from the other portions of the bottom within the dug out regions 16 of this processed substrate 19. Here, the aforementioned method for depositing an $SiO_2$ film from the vapor is not limited to sputtering vapor deposition but rather other methods such as an electron beam vapor deposition method and a plasma CVD method may be used. In addition, the period in the photoresist pattern is not limited to 490 μm but rather may be varied in accordance with the period of the high defect density regions 24 in stripe form that have been formed in the n-type GaN substrate 20.

A dry etching technology or a wet etching technology may be used as the etching method for preparing the dug out regions 16 in the processed substrate 19 as described above. In addition, the processed substrate 19 may be formed by directly digging from the surface of n-type GaN substrate 20 so as to form the dug out regions 16 as described above, or may also be formed by digging the nitride semiconductor thin films such as GaN, InGaN, AlGaN, and InAlGaN after they have been grown on the surface of the n-type GaN substrate 20.

Figure 6:
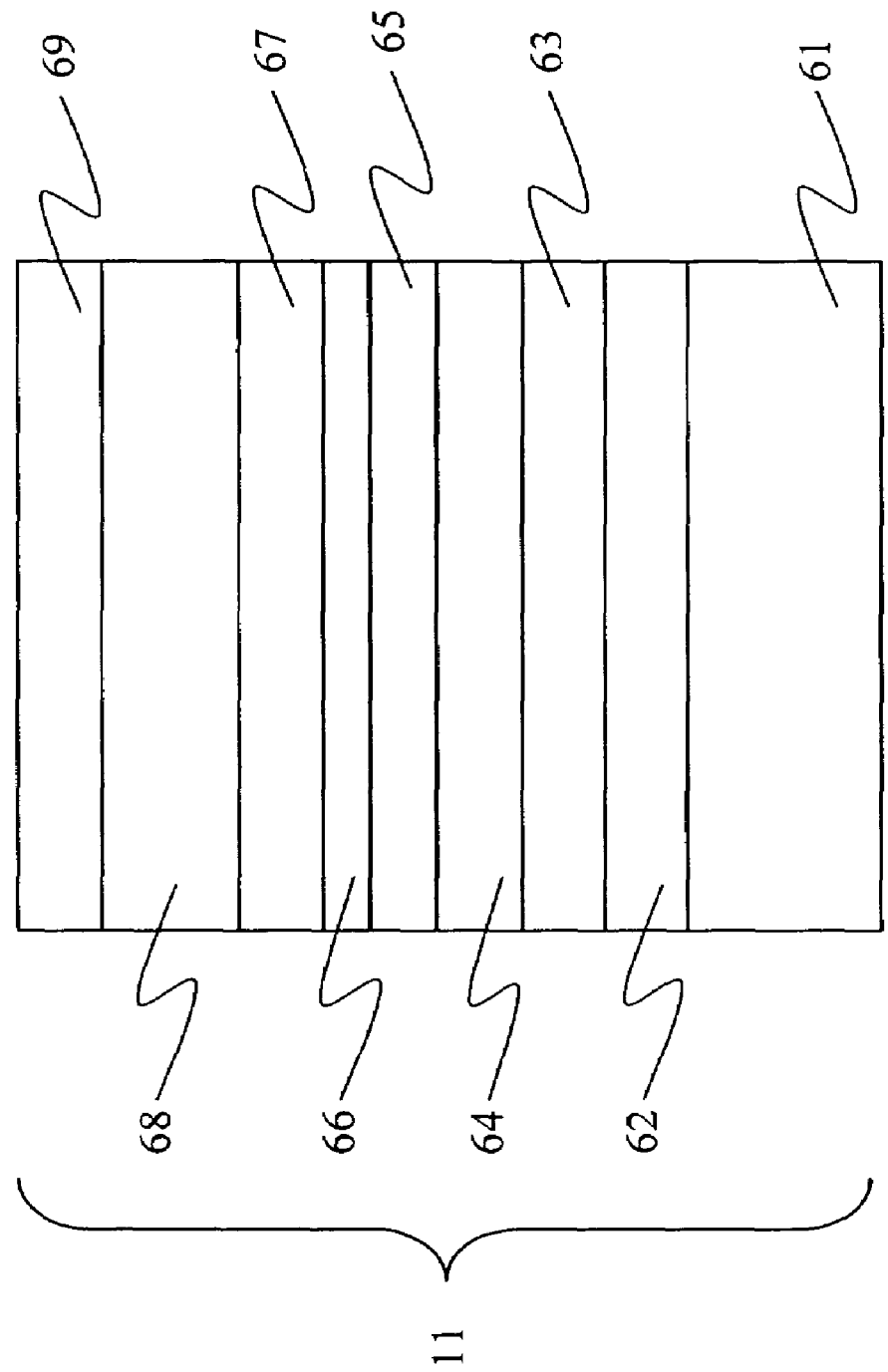
FIG. 6 is a schematic cross sectional view showing a nitride semiconductor growth layer according to an embodiment of the present invention.
Figure 8A:
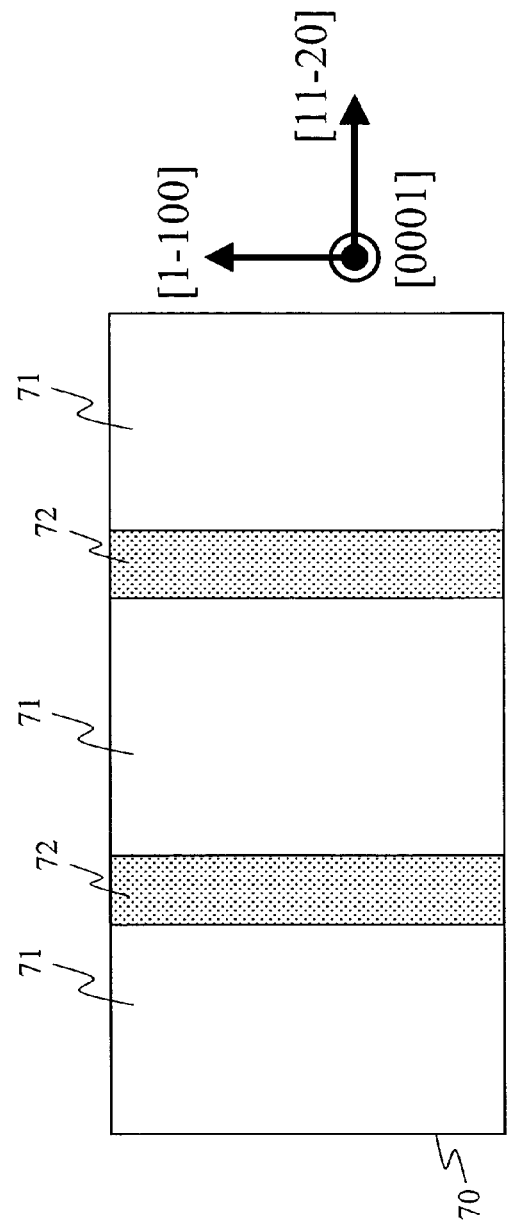
FIG. 8a is a schematic top view showing a processed substrate according to the prior art.
Figure 8B:
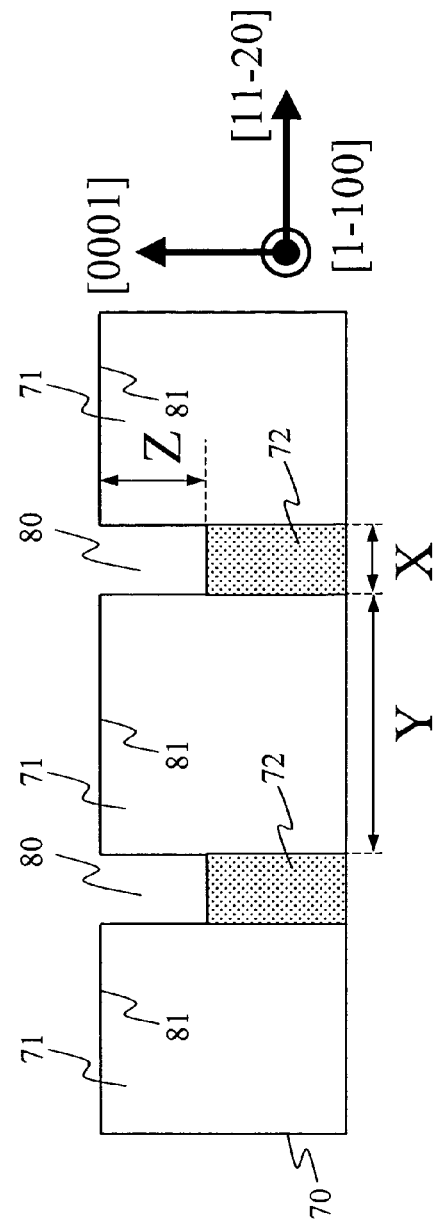
FIG. 8b is a schematic cross sectional view showing a processed substrate according to the prior art.
Figure 9:
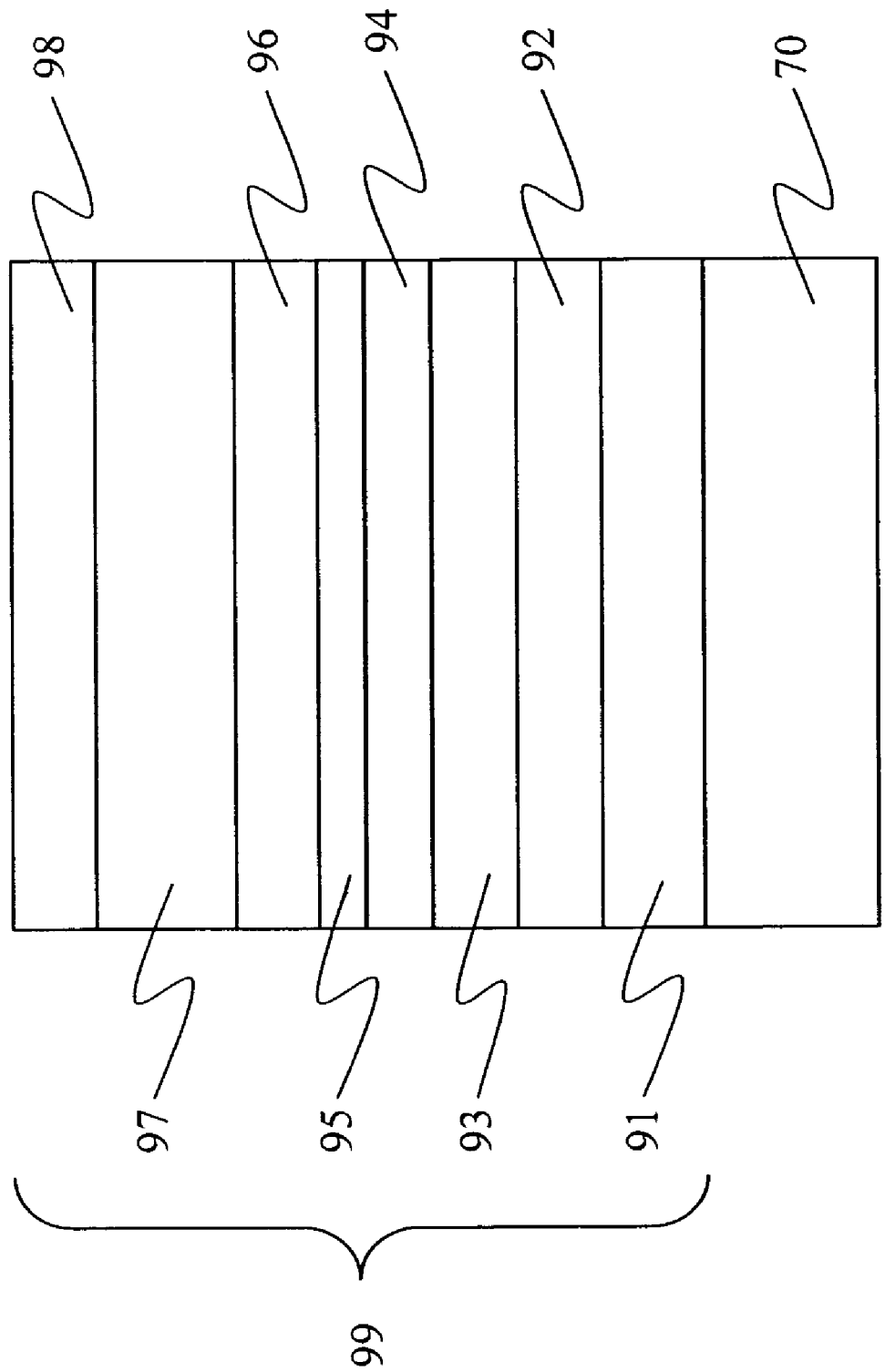
FIG. 9 is a schematic cross sectional view showing a nitride semiconductor growth layer according to the prior art.

The nitride semiconductor growth layer 11 is epitaxially grown on the processed substrate 19 that has been obtained as described above by appropriately using known technologies such as an MOCVD method, and thereby, a nitride semiconductor laser device as shown in FIG. 1a is fabricated. This nitride semiconductor growth layer 11, for example, is formed of nitride semiconductor thin films as shown in FIG. 6.

Namely, the nitride semiconductor growth layer 11 that is formed on the processed substrate 19 made of an n-type GaN that has been etched, is formed by sequentially layering an n-type $Al_{0.06}Ga_{0.94}N$ layer 61 having a thickness of 2.3 μm, an n-type $Al_{0.1}Ga_{0.9}N$ layer 62 having a thickness of 0.15 μm, an n-type $Al_{0.06}Ga_{0.94}N$ layer 63 having a thickness of 0.1 μm, an n-type GaN optical guide layer 64 having a thickness of 0.1 μm, a multiple quantum well active layer 65 formed of three InGaN well layers each having a thickness of 4 nm and four GaN barrier layers each having a thickness of 8 nm, a p-type $Al_{0.15}Ga_{0.85}N$ carrier block layer 66 having a thickness of 10 nm, a p-type GaN optical guide layer 67 having a thickness of 0.1 μm, a p-type $Al_{0.06}Ga_{0.94}N$ clad layer 68 having a thickness of 0.6 μm, and a p-type GaN contact layer 69 having a thickness of 0.1 μm on the surface of the processed substrate 19.

Figure 5:
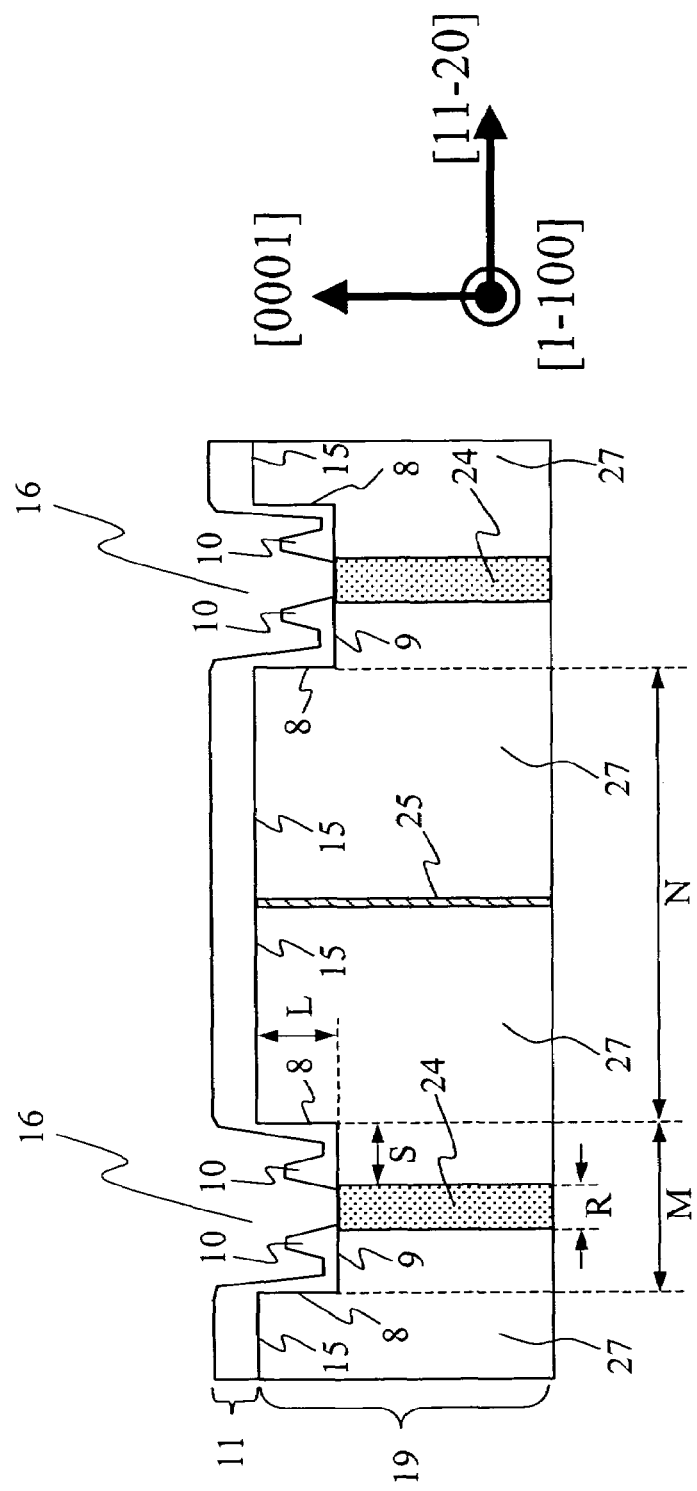
FIG. 5 is a schematic cross sectional view showing a portion of a wafer where a nitride semiconductor growth layer is layered on a processed substrate according to an embodiment of the present invention.

The nitride semiconductor growth layer 11 having such a configuration is layered on the processed substrate 19. FIG. 5 is a schematic cross sectional view showing a portion of a wafer where the nitride semiconductor growth layer 11 has been layered. As shown in FIG. 5, the abnormal growth that occurred in the conventional nitride semiconductor laser device is suppressed in the end portions of the hill 15 which is a protrusion formed on the processed substrate 19, and a high degree of flatness is attained on the surface of the nitride semiconductor growth layer 11 that has been layered on the hill 15.

In addition, the nitride semiconductor growth layer 11 is layered on the surfaces of the sides 8 and on the regions where the low defect density regions 27 have been exposed from the surface of the bottoms 9 within the dug out regions 16. Moreover, the nitride semiconductor growth layer 11 is not layered on the center portion of the region where the high defect density regions 24 are exposed from the surface of the bottoms 9 within the dug out regions 16, and abnormal growth portions 10 in protrusion form having a great thickness are formed on the peripheral portions of the regions where the high defect density regions 24 have been exposed.

As described above, the abnormal growth in the end portions of the hill 15 that was observed in the conventional nitride semiconductor laser device is suppressed because the value of the depth L of the dug out regions 16 (3 μm) is very small in comparison with the value of the width M of the openings (40 μm) in this embodiment. Namely, in the case where the value of the depth L is smaller than the value of the width M of the openings, atomic or molecular gas that becomes the material of a nitride semiconductor thin film directly enters into the dug out regions 16 and a nitride semiconductor thin film having a great thickness is formed on the sides 8 and the bottoms 9 (excluding the surfaces of the high defect density regions 24). Therefore, the nitride semiconductor thin film that has grown on the hill 15 and the nitride semiconductor thin film that has grown on the sides 8 and the bottoms 9 (excluding the surfaces of the high defect density regions 24) within the dug out regions 16 are connected to each other. As a result, atoms or molecules which adhere to the surface of the nitride semiconductor thin film that has grown on the hill 15 and which become the material of the nitride semiconductor thin film easily migrate into the dug out regions 16 without staying on the hill 15. Consequently, the abnormal growth of the nitride semiconductor growth layer 11 in the end portions of the hill 15 is suppressed.

In addition, both the portions, where the low defect density regions 27 are exposed and the portions where the high defect density regions 24 are exposed, exist at the bottoms 9 within the dug out regions 16. As described above, the surfaces of the high defect density regions 24 are terminated with N (nitrogen) while the surfaces of the low defect density regions 27 are terminated with Ga (gallium). Therefore, the adhesion coefficient of the atoms or molecules that become the materials of the nitride semiconductor thin film differs and almost no nitride semiconductor thin film is formed on the surfaces of the high defect density regions 24, whereas, the adhesion coefficient of atoms or molecules that become the material of the nitride semiconductor thin film become much larger in the peripheral portions of these high defect density regions 24 and the abnormal growth portions 10 in protrusion form having a great thickness are formed in these regions. As a result of this, the abnormal growth that occurred in the end portions of the hill 15 in the conventional nitride semiconductor laser device is suppressed.

As described above, the nitride semiconductor growth layer 11, made of a plurality of nitride semiconductor thin films, is layered on the processed substrate 19 where the dug out regions 16 have been formed, and thereby, the nitride semiconductor laser device is fabricated, wherein the dug out regions 16 are prevented from being filled in with the nitride semiconductor thin film when the nitride semiconductor thin film is layered on the processed substrate 11. In the case where the dug out regions 16 are filled in with the nitride semiconductor thin film, the aforementioned effects of suppressing the abnormal growth in the end portions of the hill 15 are lost.

As described above, the value of the width M of the openings of the dug out regions 16 is made greater than the value of the depth L, and thereby, the abnormal growth is suppressed in the end portions of the hill 15 where these values of the width M of the openings and the depth L are required to be set to appropriate values. First, as for the width M of the openings of the dug out regions 16, in the case the value of the width M of the openings is smaller than 20 μm, it becomes difficult for the atomic or molecular gas that becomes the material of a nitride semiconductor thin film to enter into the dug out regions 16. On the other hand, in the case where the value of the width M of the openings of the dug out regions 16 is greater than 100 μm, the nitride semiconductor laser device is formed on the hill 15 instead of within the dug out regions 16 (see FIG. 1a), and therefore, the number of the nitride semiconductor laser devices which are fabricated from one wafer becomes small and this is not preferable. Accordingly, it is preferable for the value of the width M of the openings of the dug out regions 16 to be in a range between 20 μm and 100 μm, both ends inclusive.

In addition, as for the depth L of the dug out regions 16, in the case where the value of the depth L is less than 3 μm, the dug out regions 16 are easily filled in with the nitride semiconductor growth layer 11 and this is not preferable. On the other hand, in the case where the value of the depth L becomes greater than 10 μm, the effects of suppressing the occurrence of abnormal growth in the end portions of the hill 15 as described above are decreased and this is not preferable. Accordingly, it is preferable for the value of the depth L of the dug out regions 16 to be in a range between 3 μm and 10 μm, both ends inclusive.

In addition, in the case where the value of the width R of the high defect density regions 24 that are exposed from the bottoms 9 in the direction parallel to the direction of [11-20] within the dug out regions 16 is smaller than 15 μm, atoms or molecules which have entered into the dug out regions 16 and which become the material of a nitride semiconductor thin film diffuse so as to cross the high defect density regions 24 and as a result, the adhesion coefficient of the atoms or molecules in the peripheral portions of the surfaces of the high defect density regions 24 becomes small. Therefore, the formation of the abnormal growth portions 10 is suppressed, making the effects of suppressing the abnormal growth in the end portions of the hill 15 small, and this is not preferable. In addition, in the case where the value of the width R is greater than 50 μm, the ratio of the high defect density regions 24 that occupy the wafer becomes great, and the ratio of the low defect density regions 27 where the nitride semiconductor laser devices are fabricated, becomes small, thus making the number of nitride semiconductor laser devices that are fabricated from one wafer small, and this is not preferable. Accordingly, it is preferable for the value of the width R of the high defect density regions 24 to be in a range between 15 μm and 50 μm, both ends inclusive. Furthermore, it is more preferable to be in a range between 20 μm and 40 μm, both ends inclusive, taking into consideration the case where any change in the process has occurred.

Moreover, in the case where the value of the gap S between the boundary between the high defect density region 24 and the low defect density region 27, and the side 8 of a dug out region 16 in the direction parallel to the direction of [11-20] is less than 2 μm at the bottom 9 within the dug out region 16, the abnormal growth portions 10 and the end portions of the hill 15 are too close to sufficiently form the abnormal growth portions 10, and therefore, the effects of suppressing the abnormal growth in the end portions of the hill 15 are decreased. Therefore, it is preferable for the gap S to be 2 μm or more, more preferably 5 μm or more.

Furthermore, in the case where the value of the width N of the hill 15 is less than 400 μm, the probability is high that atoms or molecules that become the material of the nitride semiconductor thin film that adheres to the surface of the hill 15 will migrate to the end portions of the hill 15, so as to cause abnormal growths there. In order to prevent this, it is preferable for the value of the width N of the hill 15 to be 400 μm or more, more preferably 500 μm or more. In addition, the value of the width N can be set high, as described above, and thereby, the flatness of the surface of the nitride semiconductor growth layer 11 that is layered on the hill 15 can be made excellent.

In addition, as described above, it is preferable for the value of the width M of the openings of the dug out region 16 to be in a range between 20 μm and 100 μm, both ends inclusive. In addition, it is preferable for the value of the width N of the hills 15 to be 400 μm or more. That is, it is preferable for the gap between the adjacent dug out regions 16 in the direction parallel to the direction of [11-20] to be 420 μm or more. Furthermore, in the same manner, it is preferable for the period of the high defect density regions 24 within the dug out regions 16 to be 420 μm or more.

In addition, as described above, in the case where the thickness of the nitride semiconductor growth layer 11 which is layered on the processed substrate 19 having the dug out regions 16 and the hills 15, and which is formed of a plurality of nitride semiconductor thin films is greater than 5 μm, there is a possibility that the dug out regions 16 will be filled in. Therefore, it is preferable for the thickness of the nitride semiconductor growth layer 11 to be 5 μm, both ends inclusive.

In addition, it is preferable for the nitride semiconductor growth layer 11, particularly the nitride semiconductor thin film that is directly layered on the surface of the processed substrate 19 to be grown as a nitride semiconductor thin film that includes Al (aluminum) atoms of which the length of migration is small, in order to suppress abnormal growth in the end portions of the hills 15. This is because the growth of a nitride semiconductor thin film that includes Al atoms of which the length of migration is short easily progresses, while maintaining the form of the base (form of the facets), and abnormal growth can further be suppressed, in the case where such a nitride semiconductor thin film is layered. Therefore, in the case where a film of which the Al component ratio is high is grown as the nitride semiconductor thin film that is layered on the processed substrate 19, abnormal growth can be effectively suppressed. In the case where the Al component ratio is high, however, the length of migration of Al atoms is short, and the flatness of the surface of the grown nitride semiconductor thin film does not become excellent. Therefore, nitride semiconductor thin films of which the Al component ratio is high, and nitride semiconductor thin films of which the Al component ratio is low are alternately layered so as to form a multilayered film, and thereby, abnormal growth can be suppressed in the end portions of the hill 15, and at the same time, the flatness of the surface of the multilayered film that has been layered can be made excellent.

It is preferable for the aforementioned multilayered film to be formed of an $Al_xGa_{1-x}N$ layer and an $Al_yGa_{1-y}N$ layer ($0<x\leqq0.3$, $0<y\leqq0.1$, $x<y$). In the case where the values of the film thicknesses of both of these two types of films having different Al component ratios are less than 80 nm, the effect of suppressing abnormal growth becomes small, whereas in the case where the values are greater than 3 μm, there is a probability that the dug out regions 16 will be filled in. Accordingly, it is preferable for the values of the film thicknesses of both of these two types of films having different Al component ratios to be in a range between 80 nm and 3 μm, both ends inclusive.

In addition, in the case where the film thickness of the nitride semiconductor thin films of which the Al component ratio is great is greater than the film thickness of the nitride semiconductor thin films of which the Al component ratio is small, excellent flatness in the surface of the multilayered film where these two types of nitride semiconductor thin films having different Al component ratios are layered, as described above, cannot be obtained. Accordingly, it is preferable for the value of the film thickness of the nitride semiconductor thin films of which the Al component ratio is great to be smaller than the value of the film thickness of the nitride semiconductor thin films of which the Al component ratio is small. In addition, it is preferable for the surface of the multilayered film formed of these two types of nitride semiconductor thin films having different Al component ratios to be a nitride semiconductor thin film of which the Al component ratio is low, so that mismatching of lattices with the other nitride semiconductor thin film that is additionally layered on top of this multilayered film is reduced, strain in the nitride semiconductor thin film is reduced, and in addition, the surface coarseness caused by this strain is suppressed.

In addition, according to this embodiment, the processed substrate 19 on which the nitride semiconductor growth layer 11 is layered, as described above, is fabricated using the n-type GaN substrate 20 of which the off angle θ is 0.18° (see FIG. 3b). By making this off angle θ 0.15° or more, abnormal growth that occurred in the same manner in both end portions of each hill 15 becomes more significant only on one side of the two end portions, while abnormal growth is suppressed on the other side. In addition, in the case where the off angle is greater than 0.5°, the surface of the nitride semiconductor growth layer 11 that is layered on the hills 15 morphologically deteriorates. Therefore, it is preferable for the value of the off angle θ of the n-type GaN substrate 20 that is used to fabricate the processed substrate 19 to be in a range between 0.15° and 0.5°, both ends inclusive.

As described above, the nitride semiconductor growth layer 11 is formed on the processed substrate 19 without causing abnormal growth in the end portions of the hills 15, and thereby, the nitride semiconductor laser device shown in FIG. 1a is fabricated.

In the nitride semiconductor laser device of FIG. 1a, the nitride semiconductor growth layer 11, having a layered structure made of a plurality of nitride semiconductor thin films shown in FIG. 6 is formed on the processed substrate 19 having the dug out regions 16. In addition, the ridge stripe 12 and the dielectric film 13 which is provided so as to sandwich the ridge stripe 12 and made of $SiO_2$ for the purpose of narrowing a current are formed on the surface of the nitride semiconductor growth layer 11 in accordance with a photolithographic technology and a dry etching technology. In addition, the p-side electrode 14 is formed on the respective surfaces of the ridge stripe 12 and the dielectric film 13 while the n-side electrode 7 is formed on the rear surface of the processed substrate 19. Here, the protrusion on the surface of the p-side electrode 14 is referred to as stripe 17. Furthermore, abnormal growth is suppressed in the end portion 18 of the nitride semiconductor growth layer 11 that has been layered on the hills 15. In addition, the dug out regions 16 are not completely filled in with the nitride semiconductor growth layer 11, and the nitride semiconductor growth layer 11 is layered on the surfaces of the regions where the low defect density regions 27 are exposed from the sides 8 and the bottoms 9. Furthermore, the abnormal growth portions 10 which are protrusions having a large thickness are formed on the peripheral portions of the regions from which the high defect density regions 24 are exposed at the bottoms 9 within the dug out regions 16. In addition, the high luminescence region 25 is formed in the center portion of the hill 15.

The aforementioned ridge stripe 12 is formed by forming a resist pattern in stripe form that extends in the direction of [1-100] in accordance with a conventional photolithographic technology and by carrying out etching in accordance with an RIE technology using a plasma source such as ICP (Inductively Coupled Plasma). Here, etching is carried out as deep as the middle of the p-type $Al_{0.06}Ga_{0.94}N$ clad layer 68 (see FIG. 6) starting from the surface of the nitride semiconductor growth layer 11. The width of the formed ridge stripe 12 in the direction parallel to the direction of [11-20] is approximately 1.6 μm. In addition, the distance between the center of the hill 15 and the center of the ridge stripe 12 is denoted as d. Here, this distance d is 10 μm according to this embodiment.

As for the position where the ridge stripe 12 is formed, in the case where a nitride semiconductor laser device is fabricated with the ridge stripe 12 formed above the center portion (high luminescence region 25) of the hill 15, the obtained nitride semiconductor laser device has a large value of threshold current and does not have excellent properties. Therefore, it was found that the ridge stripe 12 is formed in a manner where the center portion of the ridge stripe 12 is at a distance of 3 μm or more away from the center portion (high luminescence region 25) of the hill 15, and thereby, a nitride semiconductor laser device having excellent properties can be obtained. Here, end surfaces of resonators are formed by dividing a wafer where nitride semiconductor laser devices have been fabricated on a processed substrate 19 as shown in FIG. 1a into bars, and then the end surfaces of resonators are coated followed by division of the bars into chips for obtaining individual nitride laser devices in accordance with well known technologies which are applied in an appropriate manner, and therefore, the descriptions of these methods will not be given.

In addition, when the gap (period) of the adjacent high defect density regions 24 in the direction parallel to the direction of [11-20] is denoted as A, a nitride semiconductor laser device having excellent properties can not be obtained in the case where the aforementioned distance d is greater than 0.25×A. Accordingly, at the time of manufacture of the ridge stripe 12, it is preferable for the distance d between the center (high luminescence region 25) of the hill 15 and the center portion of the ridge stripe 12 to be in a range between 3 μm and 0.25×A, both ends inclusive, and it is preferable for the ridge stripe 12 to be formed in a low defect density region 27 that does not include a dug out region 16.

When a nitride semiconductor laser device is fabricated as described above, abnormal growth is suppressed in the end portions 18 of the nitride semiconductor growth layer 11 that has been layered on the hill 15 and excellent surface flatness is obtained also in the regions other than the end portions 18 of the nitride semiconductor growth layer 11 that has been layered on the hill 15. As a result of this, a resist pattern having a desired form and dimensions is formed in the lithographic process, and consequently, the yield in the manufacture of a nitride semiconductor laser device is increased.

Here, in FIG. 1a, though one nitride semiconductor laser device is fabricated on a hill 15, the present invention is not limited thereto, but rather, another nitride semiconductor laser device, for example, may be fabricated in a region on the opposite side (left side in FIG. 1a) are relative to the high luminescence region 25 in the center portion of the hill 15. In addition, additional nitride semiconductor laser devices may be fabricated if possible.

Here, though in this embodiment the n-type GaN substrate 20 having the high defect density regions 24 in stripe form that have been periodically formed is used and the dug out regions 16 are periodically formed in the n-type GaN substrate 20 so as to correspond to the positions of the high defect density regions 24, the present invention is not limited thereto. Namely, in the case where the dug out regions 16 are formed so as to include the high defect density regions 24 that have been formed in the n-type GaN substrate 20, the high defect density regions 24 and the dug out regions 16 may not be periodically formed. In addition, it is not necessary for the center portions of the high defect density regions 24 to be positioned in the center portions of the bottoms 9 within the dug out regions 16.

A nitride semiconductor laser device that is fabricated as described above can preferably be used for optical apparatuses such as magneto-optical reproduction and recording apparatuses, high density recording and reproduction apparatuses, laser printers, barcode readers and projectors.

What is claimed is:

1. A nitride semiconductor light emitting device comprising:
    a processed substrate whose main surface is (0001) surface where a dug out region which is a recess in stripe form and a hill which is a protrusion are provided in a surface of a nitride semiconductor substrate where at least the surface is formed of a nitride semiconductor; and
    a nitride semiconductor growth layer which is formed of a plurality of nitride semiconductor thin films layered on the surface of the processed substrate, wherein
    the dug out region is a trench having sides and a bottom,
    a first region having a first average defect density and a second region having a defect density of which the value is higher than that of the first average defect density are respectively formed so as to be aligned in stripe form in the direction parallel to the direction in which the dug out region extends in the processed substrate,
    the polarity of the first region and the polarity of the second region are inversions of each other, and
    in the processed substrate before the nitride semiconductor growth layer is layered, the second region and the first region which are positioned in both sides of the second region are both exposed from the bottom of the dug out region.

2. The nitride semiconductor light emitting device according to claim 1, wherein
    the value of the width of the opening of the dug out region is greater than that of the depth of the dug out region.

3. The nitride semiconductor light emitting device according to claim 1, wherein
    the dug out region is not completely filled in with the nitride semiconductor growth layer.

4. The nitride semiconductor light emitting device according to claim 1, wherein
    the polarity of the second region is nitrogen.

5. The nitride semiconductor light emitting device according to claim 1, wherein
    the polarity of the first region is gallium.

6. The nitride semiconductor light emitting device according to claim 1, wherein
    the off angle of the upper surface of the nitride semiconductor substrate is in a range between 0.15° and 0.5°, both ends inclusive.

7. The nitride semiconductor light emitting device according to claim 1, wherein
    the width of the opening of the dug out region is in a range between 20 μm and 100 μm, both ends inclusive.

8. The nitride semiconductor light emitting device according to claim 1, wherein
    the depth of the dug out region is in a range between 3 μm and 10 μm, both ends inclusive.

9. The nitride semiconductor light emitting device according to claim 1, wherein
    the width of the second region in the direction perpendicular to the direction in which the second region extends in stripe form is in a range between 15 μm and 50 μm, both ends inclusive.

10. The nitride semiconductor light emitting device according to claim 1, wherein
    the gap between the boundary between the first region and the second region on the surface of the bottom and the side of the dug out region that is adjacent to the boundary is 2 μm or more within the dug out region.

11. The nitride semiconductor light emitting device according to claim 1, wherein
    the width of the hill is 400 μm or more.

12. The nitride semiconductor light emitting device according to claim 1, wherein
    the thickness of the nitride semiconductor growth layer is 5 μm or less.

13. The nitride semiconductor light emitting device according to claim 1, wherein
    the layer of the nitride semiconductor growth layer layered on the processed substrate which makes contact with the processed substrate is a multilayered film formed of an $Al_xGa_{1-x}N$ layer and an $Al_yGa_{1-y}N$ layer of which the Al component ratios are different, and the relationship between the Al component ratio x of the $Al_xGa_{1-x}N$ layer and the Al component ratio y of the $Al_yGa_{1-y}N$ layer satisfies $0<x\leqq0.3$, $0<y\leqq0.1$ and $x<y$.

14. The nitride semiconductor light emitting device according to claim 13, wherein the thicknesses of the $Al_xGa_{1-x}N$ layer and the $Al_yGa_{1-y}N$ layer that form the multilayered film are both in a range between 80 nm and 3 μm, both ends inclusive.

15. The nitride semiconductor light emitting device according to claim 13, wherein the thickness of the $Al_xGa_{1-x}N$ layer of which the Al component ratio is large is thinner than the thickness of the $Al_yGa_{1-y}N$ layer of which the Al component ratio is small.

16. The nitride semiconductor light emitting device according to claim 13, wherein the nitride semiconductor thin film that forms the topmost surface of the multilayered film is the $Al_xGa_{1-x}N$ layer of which the Al component ratio is small.

17. The nitride semiconductor light emitting device according to claim 1, wherein a ridge stripe for narrowing a current is formed in a portion of the first region other than the dug out region on the surface of the nitride semiconductor growth layer, and when the distance between the center portion of the ridge stripe and the center portion of the hill is denoted as d and the gap between the center portions of the two adjacent dug out regions in the direction perpendicular to the direction in which the dug out regions extends is denoted as A, $3\ \mu m\leqq d\leqq 0.25\times A$ is achieved.

18. The nitride semiconductor light emitting device of claim 1, wherein a bottom surface of the dug out region is defined, at least in part, by a surface of the first and second regions, and the nitride semiconductor growth layer is present on the surface of the first region.

19. The nitride semiconductor light emitting device of claim 18, further comprising abnormal growth portions located on the surface of the first region defining, at least a part, the bottom surface of the dug out region.

* * * * *